(12) United States Patent
Park

(10) Patent No.: US 6,870,214 B2
(45) Date of Patent: Mar. 22, 2005

(54) METHOD OF FABRICATING FLASH EEPROM

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/329,898

(22) Filed: Dec. 26, 2002

(65) Prior Publication Data

US 2003/0122184 A1 Jul. 3, 2003

(30) Foreign Application Priority Data

Dec. 29, 2001 (KR) ................................ 10-2001-0088236

(51) Int. Cl.[7] .......................................... H01L 29/788
(52) U.S. Cl. ...................... 257/315; 257/315; 257/30
(58) Field of Search ...................... 257/315, 30, 316; 438/201, 209, 211, 238, 242, 270

(56) References Cited

U.S. PATENT DOCUMENTS

| | | | |
|---|---|---|---|
| 5,483,094 A | * | 1/1996 | Sharma et al. ............... 257/316 |
| 6,040,210 A | * | 3/2000 | Burns et al. ................. 438/238 |
| 6,232,631 B1 | * | 5/2001 | Schmidt et al. ............. 257/315 |
| 6,433,382 B1 | * | 8/2002 | Orlowski et al. ........... 257/315 |

* cited by examiner

*Primary Examiner*—David Nelms
*Assistant Examiner*—Thinh T Nguyen
(74) *Attorney, Agent, or Firm*—Timothy J Keefer; Seyfarth Shaw LLP

(57) ABSTRACT

A flash EEPROM cell and fabricating method thereof. The cell comprises: a silicon substrate; a silicon pillar layer formed on the silicon substrate; a tunnel insulating film and a floating electrode, formed on the silicon pillar layer; a control gate insulating film and a control gate electrode, formed on the floating electrode; a source region formed in the silicon substrate; a drain region formed on the silicon pillar layer; and bit lines formed on the drain region. The method comprises: providing a silicon substrate; forming a silicon pillar layer on the silicon substrate; forming a tunneling insulating film and a floating electrode; successively forming a control gate insulating film and a control gate electrode; forming a source region and a drain region in the silicon substrate, and on the silicon pillar layer, respectively; and forming bit lines.

4 Claims, 3 Drawing Sheets

METHOD OF FABRICATING FLASH EEPROM

BACKGROUND OF THE INVENTION

1. Field of the Invention

The present invention relates in general to a flash EEPROM cell, and more particularly to a split gate flash EEPROM cell having an anisotropic pillar silicon layer, and also to a method for fabricating the same.

2. Description of the Prior Art

Generally, an EEPROM cell means an electrically erasable programmable read-only memory device.

In realizing this flash EEPROM cell, shrinkability is greatly restricted by over-erasing issue and the reliability of a tunneling oxide film.

SUMMARY OF THE INVENTION

Accordingly, the present invention has been made to solve the above-mentioned problems occurring in the prior art, and an object of the present invention is to provide a flash EEPROM cell and a fabricating method thereof, which is formed in the form of a pillar-shaped vertical EEPROM cell using an epitaxial process, so that it can be can be highly integrated and the number of mask processes can be reduced to allow a fabricating process to be simple To above the above object, in one aspect, the present invention provides to a flash EEPROM cell, which comprises: a silicon substrate; a silicon pillar layer formed on the silicon substrate; a tunnel insulating film and a floating electrode, which were formed on the sidewall of the silicon pillar layer; a control gate insulating film and a control gate electrode, which were formed on the sidewall of the floating electrode; a source region formed in the silicon substrate at a portion below the side of the control gate electrode; a drain region formed on the upper surface of the silicon pillar layer; and bit lines formed on the drain region.

In another aspect, the present invention provides a method for fabricating an EEPROM cell, which comprises the steps of: providing a silicon substrate; forming a silicon pillar layer on the silicon substrate; forming a tunnel insulating film and a floating electrode on the sidewall of the silicon pillar layer; successively forming a control gate insulating film and a control gate electrode on the sidewall of the floating electrode; forming a source region and a drain region in the silicon substrate at a portion below the side of the control gate electrode, and on the upper surface of the silicon pillar layer, respectively; and forming bit lines on the drain region.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

The present invention will hereinafter be described in further detail with reference to the accompanying drawings.

Figure 1:
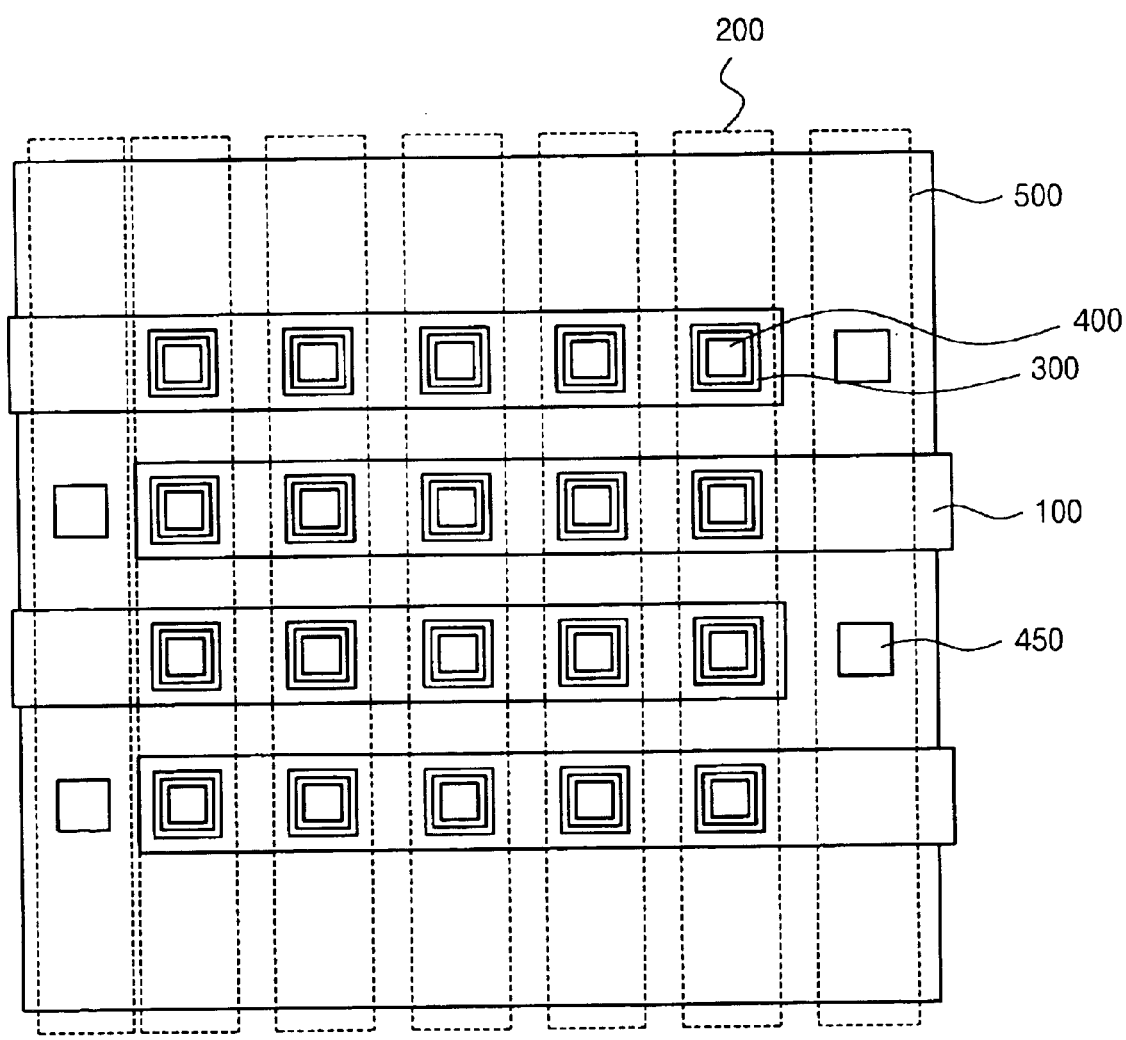
FIG. 1 is a layout drawing, which illustrates a flash EEPROM cell and a fabricating method thereof according to the present invention.

FIG. 1 is a layout drawing, which illustrates an EEPROM cell and a fabricating method thereof according to the present invention.

As shown in FIG. 1, a flash EEPROM cell according to the present invention has a plurality of word lines 100 arranged on a semiconductor wafer at fixed intervals, and a plurality of bit lines 200 arranged at fixed intervals, which are intersected perpendicularly with the word lines 100.

Moreover, floating gates 300 are disposed at portions where the word lines 100 and the bit lines 200 overlap with each other. Pillar cells 400 are formed in the inner region of the floating gates 300.

Furthermore, a source line 500 is disposed at a fixed distance from the bit lines 200 while being intersected perpendicularly with the word lines 100.

Hereinafter, a method for fabricating the inventive flash EEPROM cell having the layout as described above will be described in detail with reference to FIGS. 2 to 5.

FIGS. 2 to 5 are cross-sectional views, which illustrate a flash EEPROM cell and a fabricating method thereof according to the present invention.

Figure 2:
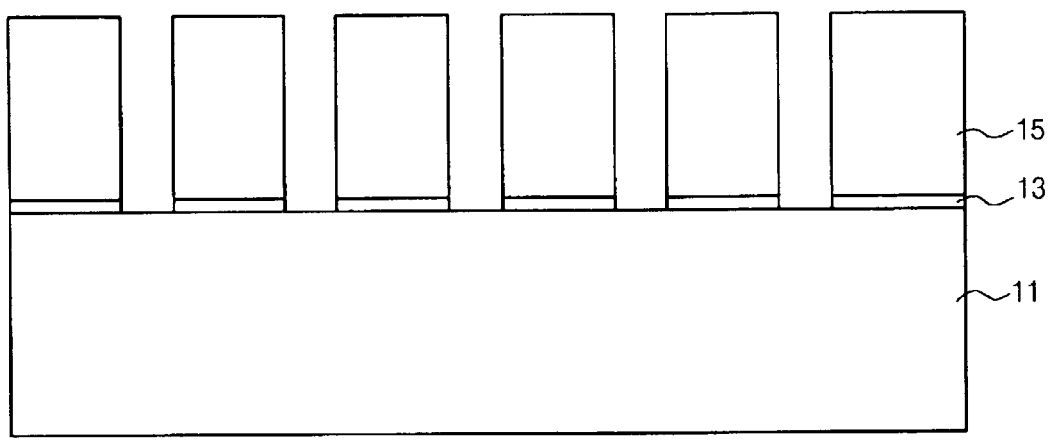
FIGS. 2 to 5 are cross-sectional views, which illustrate a flash EEPROM cell and a fabricating method thereof according to the present invention.

As shown in FIG. 2, the method for fabricating the flash EEPROM cell according to the present invention includes thermally growing a pad oxide film 13 on a silicon substrate 11, followed by applying photoresist on the pad oxide film 13.

Then, the photoresist is exposed to light, developed, and patterned to form a photoresist film pattern 15 serving as a pillar mask.

Next, the pad oxide film 13 is selectively patterned according to a dry etching or wet etching process using the photoresist pattern 15 as a mask. At this time, the pad oxide film 13 is selectively etched, so that the silicon substrate is partially exposed.

Figure 3:
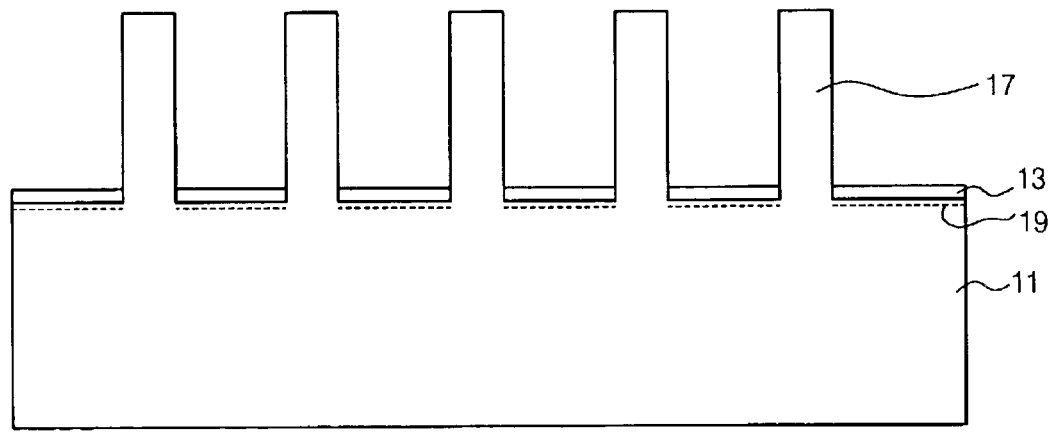

As shown in FIG. 3, a silicon pillar layer 17, for example, a doped epitaxial silicon layer, is then formed using the exposed surface of the silicon substrate 11 as a seed, according to an anisotropic epitaxial process.

After this, ions are implanted into the silicon substrate 11 at portions below both sides of the silicon pillar layer 17, so as to form an ion-implanted region 19 for controlling threshold voltage.

Figure 4:
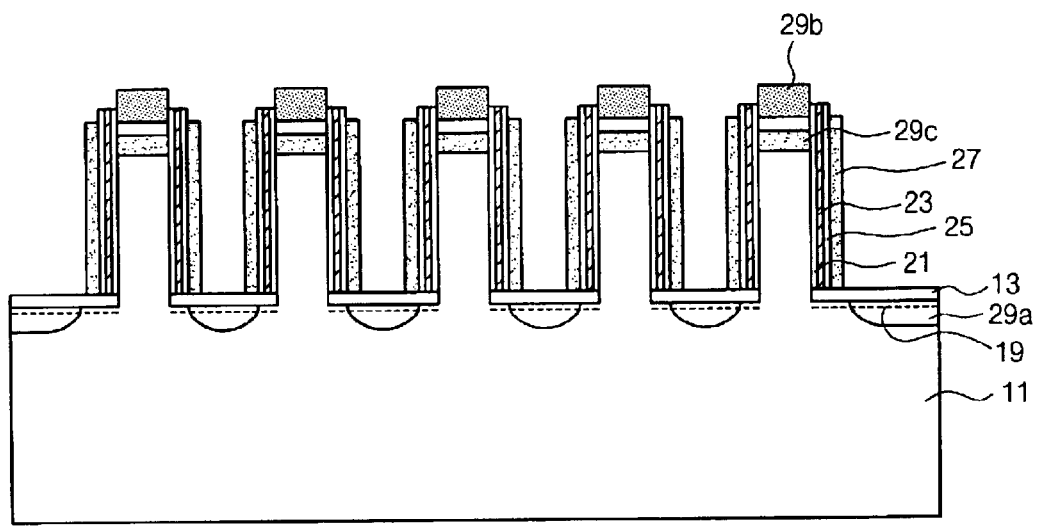

As shown in FIG. 4, a tunnel insulating film (not shown) is then deposited on the entire structure, followed by depositing a conducting layer (not shown) serving as a floating gate.

Next, the conducting layer (not shown) and the tunnel insulating film (not shown) are patterned by anisotropic dry etching, so as to form an tunnel insulating film pattern 21 and a floating electrode 23, which cover the silicon pillar layer 17.

Then, a control gate insulating film (not shown) and a conducting layer (not shown) serving as a control gate are deposited on the entire structure, and patterned by anisotropic dry etching so as to form a control gate insulating film pattern 25 and a control gate 27.

Then, impurity ions are implanted into the resulting structure so that a $N^+$ source region 29a is formed in the silicon substrate 11 at a portion below both sides of the control gate 27, and a $N^+$ drain region 29b is formed in the inner region of the upper portion of the silicon pillar layer 17. In order to increase programming speed, a region 29c for accelerating hot carrier generation are formed just below the $N^+$ drain region 29b. At this time, the step of forming the hot carrier generation-accelerating region 29c consists of carrying out boron implantation (e.g., $10^{12}$ to $10^{+3}$) at epitaxial layer growth to form a boron-doped region. In this way, the gap between the pillars is made narrow in a direction perpendicular to the bit lines, so that the connection of the word lines is completed in the form of self-masking.

Figure 5:
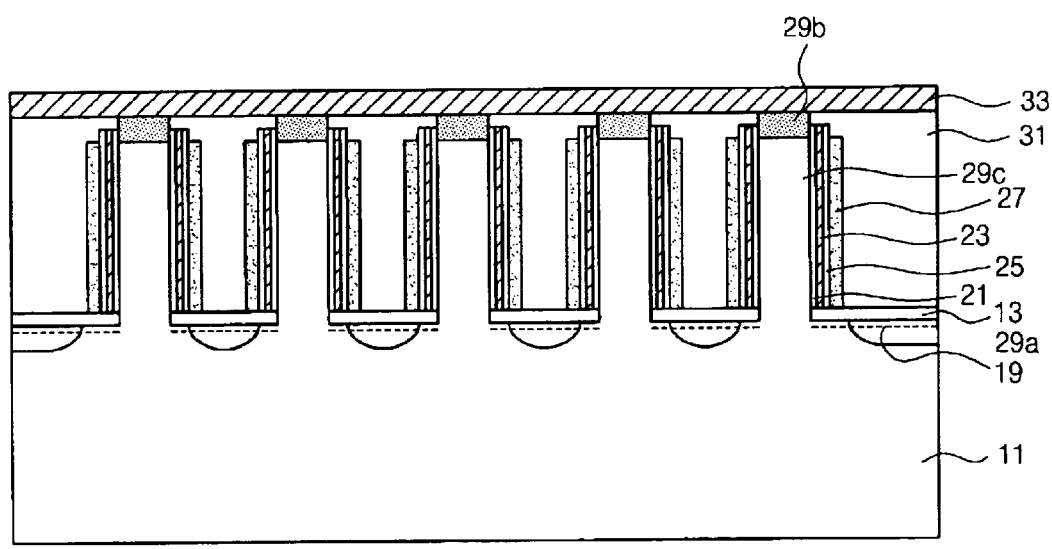

As shown in FIG. 5, a insulating film 31 for device-to-device isolation is then deposited on the entire structure in a thick layer, and planarized by a CMP process in such a manner that the $N^+$ drain region 29b is exposed. At this time, bit line contacts, which will be used at a subsequent process, are self-generated without using a separate mask.

Thereafter, bit lines 33 are formed on the planarized insulating film 31 including the exposed surface of the drain region 29b. At this time, although being not shown in the drawings, the bit lines 33 are subjected to a separate mask process and a dry etching process. In this way, the bit lines 33 are finished.

As described above, the flash EEPROM cell and the fabricating method thereof have the following effects.

In the flash EEPROM cell and the fabricating method thereof, the flash EEPROM cell is formed in the form of a pillar-shaped vertical flash EEPROM cell by means of the epitaxial process, so that it can be highly integrated and the number of separate mask processes can be reduced to allow a fabricating process to be simple.

Furthermore, when connecting the drain region to the bit lines, the bit line contacts can be self-generated without using a separate mask, so that the number of mask processes can be reduced to enable a fabricating process to be simple.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating an EEPROM cell, which comprises the steps of:

providing a silicon substrate;

forming a pad oxide on the silicon substrate so that the silicon substrate is partially exposed;

forming a silicon pillar layer on the silicon substrate wherein the silicon pillar layer is forming, using the exposed surface of the silicon substrate as a seed, according to an anisotropic epitaxial process;

forming a tunneling insulating film and a floating electrode on the sidewall of the silicon pillar layer;

successively forming a control gate insulating film and a control gate electrode on the sidewall of the floating electrode;

forming a source region and a drain region in the silicon substrate at a portion below the side of the control gate electrode, and on the upper surface of the silicon pillar layer, respectively; and forming bit lines on the drain region.

2. The method of claim 1, which additionally comprises the steps of forming a hot carrier generation-accelerating region made of a boron-doped epitaxial layer below the drain region.

3. The method of claim 1, in which the silicon pillar layer is an epitaxial silicon layer.

4. The method of claim 1, in which the step of forming the bit lines on the drain region comprises the sub-steps of forming an isolating oxide film on the entire structure including the drain; planarizing the isolating oxide film in such a manner that the surface of the drain region is exposed; depositing a conducting layer for forming the bit lines, on the isolating oxide film including the surface of the drain region; selectively patterning the conducting layer to form the bit lines.

* * * * *